(12) United States Patent
Hou et al.

(10) Patent No.: US 8,842,232 B2
(45) Date of Patent: Sep. 23, 2014

(54) THIN FILM TRANSISTOR WITH PARASITIC CAPACITANCE COMPENSATION STRUCTURE AND LIQUID CRYSTAL DISPLAY USING SAME

(75) Inventors: Hunglung Hou, Guangdong (CN); Chiayu Lee, Guangdong (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 261 days.

(21) Appl. No.: 13/517,975

(22) PCT Filed: Apr. 3, 2012

(86) PCT No.: PCT/CN2012/073502
§ 371 (c)(1),
(2), (4) Date: Jun. 20, 2012

(87) PCT Pub. No.: WO2013/139054
PCT Pub. Date: Sep. 26, 2013

(65) Prior Publication Data
US 2013/0242218 A1    Sep. 19, 2013

(30) Foreign Application Priority Data
Mar. 19, 2012  (CN) .......................... 2012 1 0073178

(51) Int. Cl.
*G02F 1/136* (2006.01)
(52) U.S. Cl.
USPC .......................................................... 349/46

(58) Field of Classification Search
USPC .................................... 349/38, 41, 42, 43, 46
See application file for complete search history.

(56) References Cited

U.S. PATENT DOCUMENTS

2004/0080681 A1 * 4/2004 Moon ............................. 349/43

FOREIGN PATENT DOCUMENTS

| CN | 1959984 A | 5/2007 |
|---|---|---|
| TW | 201027213 A1 | 7/2010 |

* cited by examiner

*Primary Examiner* — Paul Lee
(74) *Attorney, Agent, or Firm* — Cheng-Ju Chiang

(57) ABSTRACT

A thin film transistor includes a gate terminal, an insulation layer formed on the gate terminal, a first semiconductor silicon layer formed on the insulation layer, a source terminal formed on the first semiconductor silicon layer, and a drain terminal. The drain terminal is partially located on the insulation layer and the first semiconductor silicon layer. The drain terminal and the gate terminal overlap each other via the insulation layer to form a first overlap region and also overlap each other via the first semiconductor silicon layer and the insulation layer to form a second overlap region. The first and second overlap regions respectively generate first and second parasitic capacitances. The thin film transistor includes a compensation structure, whereby when the drain terminal is shifted with respect to the gate terminal, the compensation structure maintaining area of the first overlap region and area of the second overlap region unchanged.

9 Claims, 3 Drawing Sheets

THIN FILM TRANSISTOR WITH PARASITIC CAPACITANCE COMPENSATION STRUCTURE AND LIQUID CRYSTAL DISPLAY USING SAME

BACKGROUND OF THE INVENTION

1. Field of the Invention

The present invention relates to the technical field of liquid crystal displaying, and in particular to a thin film transistor (TFT) with a parasitic capacitance compensation structure and a liquid crystal display device using the TFT.

2. The Related Arts

Liquid crystal displays are the most commonly used displays, which, when compared to the traditional cathode ray tube (CRT) displays, show various advantages including compact device size, low power consumption, and low voltage driving. The liquid crystal display device has a display zone that is composed of a plurality of pixel areas. Each pixel area is an area delimited by two scan lines and two data lines and comprising a thin film transistor (TFT) that serves as a switch and a pixel electrode.

As shown in FIG. 1, which is a schematic view showing a conventional thin film transistor, the thin film transistor comprises a gate terminal 100, an insulation layer (not shown) formed on the gate terminal 100, a semiconductor silicon layer 200 formed on the insulation layer, a source terminal 300 formed on the semiconductor silicon layer 200, and a drain terminal 400. The semiconductor silicon layer 200 is formed between the gate terminal 100 and the source terminal 300 and between the gate terminal 100 and a portion of the drain terminal 400. The drain terminal 400 is electrically connected to a pixel electrode (not shown). The source terminal 300 is electrically connected to the data line 500. The drain terminal is of an inverted L-shape. The drain terminal 400 and the gate terminal 100 overlap each other via the insulation layer so as to form a first overlap region A and also overlap each other via the semiconductor silicon layer and the insulation layer to form a second overlap region B. The first overlap region A and the second overlap region B respectively induce a first parasitic capacitance and a second parasitic capacitance. The first parasitic capacitance and the second parasitic capacitance together form a parasitic capacitance $C_{gd}$ between the drain terminal 400 and the gate terminal 100. When shifting occurs in the manufacture of a thin film transistor, the areas of the first overlap region A and the second overlap region B are changed and this leads to variation of the parasitic capacitance $C_{gd}$.

According to the formula of feed-through voltage, the feed-through voltage $\Delta V$ is as follows:

$$\Delta V = \frac{C_{gd}}{C_{lc} + C_s + C_{gd}} \times V_{p\_p}$$

where $C_{lc}$ is capacitance generated by the liquid crystal cell, $C_s$ is storage capacitance, $C_{gd}$ is capacitance of the coupling capacitor between the gate terminal 100 and the drain terminal 400, namely the parasitic capacitance, and $V_{p\_p}$ is voltage variation of the gate terminal 100.

It can be seen that the parasitic capacitance $C_{gd}$ influences the magnitude of the feed-through voltage. The larger the parasitic capacitance $C_{gd}$ is, the larger the feed-through voltage will be and the lower the central potential level between positive and negative half cycles will be; the smaller the parasitic capacitance $C_{gd}$ is, the smaller the feed-through voltage will be and the higher the central potential level between the positive and negative half cycles will be. The inconsistency of the feed-through voltage leads to irregular central potential level between the positive and negative half cycles, making the liquid crystal display panel showing inconsistent brightness or causing flicking problems.

To overcome such a problem, as shown in FIG. 2, an end of the drain terminal 400' is extended to show a T-shape and a through slot 120' is formed in the gate terminal 100' at a corresponding site in order to reduce the variation of $C_{gd}$ when changes occur in the manufacture process. However, the parasitic capacitance generated by an overlap region between the extension section 420' of the drain terminal 400' and the gate terminal 100' and the parasitic capacitance generated by an overlap region between the drain terminal 400' and the gate terminal 100' via the semiconductor silicon layer 200' cannot compensate each other. Apparently, further improvement is desired.

SUMMARY OF THE INVENTION

An object of the present invention is to provide a thin film transistor with a parasitic capacitance compensation structure, which forms a compensation structure by adding a semiconductor silicon layer under the drain terminal or removing a portion of a semiconductor silicon layer in order to form a compensation structure, keeping the feed-through voltage stable and having a simple structure that is easily to realize.

Another object of the present invention is to provide a liquid crystal display, which uses the thin film transistor with a parasitic capacitance compensation structure to overcome the inconsistent brightness and flicking problems caused by inconsistent central level of various areas of the liquid crystal display.

To achieve the objects, the present invention provides a thin film transistor with parasitic capacitance compensation structure, comprising a gate terminal, an insulation layer formed on the gate terminal, a first semiconductor silicon layer formed on the insulation layer, a source terminal formed on the first semiconductor silicon layer, and a drain terminal. The drain terminal is partially located on the insulation layer and the first semiconductor silicon layer. The drain terminal and the gate terminal overlap each other via the insulation layer to form a first overlap region and also overlap each other via the first semiconductor silicon layer and the insulation layer to form a second overlap region. The first overlap region and the second overlap region respectively generate a first parasitic capacitance and a second parasitic capacitance. The thin film transistor further comprises a compensation structure, whereby when the drain terminal is shifted with respect to the gate terminal, the compensation structure maintains area of the first overlap region and area of the second overlap region unchanged.

The drain terminal is of a T-shape, which comprises a first body and a second body perpendicular to the first body. The first body has one end arranged on the first semiconductor silicon layer and an opposite end arranged on the insulation layer. The gate terminal forms a through hole in a portion corresponding to the second body of the drain terminal. The compensation structure is arranged to correspond to the one end or the opposite end of the first body.

The compensation structure comprises a second semiconductor silicon layer formed on the insulation layer. Said opposite end of the first body is arranged on the second semiconductor silicon layer.

The first semiconductor silicon layer and the second semiconductor silicon layer are individually an amorphous silicone layer.

The compensation structure comprises a through hole formed in the first semiconductor silicon layer. Said one end of the first body is located above the through hole.

The present invention also provides a liquid crystal display, which comprises a backlight module, a liquid crystal panel arranged on the backlight module, and a bezel arranged on the liquid crystal panel. The liquid crystal panel comprises a color filter substrate and an array substrate that are laminated on each other. The array substrate comprises a thin film transistor and is electrically connected to a pixel electrode of the thin film transistor. The thin film transistor comprises a gate terminal, an insulation layer formed on the gate terminal, a first semiconductor silicon layer formed on the insulation layer, a source terminal formed on the first semiconductor silicon layer, and a drain terminal. The drain terminal is partially located on the insulation layer and the first semiconductor silicon layer. The drain terminal and the gate terminal overlap each other via the insulation layer to form a first overlap region and also overlap each other via the first semiconductor silicon layer and the insulation layer to form a second overlap region. The first overlap region and the second overlap region respectively generate a first parasitic capacitance and a second parasitic capacitance. The thin film transistor further comprises a compensation structure, whereby when the drain terminal is shifted with respect to the gate terminal, the compensation structure maintaining area of the first overlap region and area of the second overlap region unchanged.

The drain terminal is of a T-shape, which comprises a first body and a second body perpendicular to the first body. The first body has one end arranged on the first semiconductor silicon layer and an opposite end arranged on the insulation layer. The gate terminal forms a through hole in a portion corresponding to the second body of the drain terminal. The compensation structure is arranged to correspond to the one end or the opposite end of the first body.

The compensation structure comprises a second semiconductor silicon layer formed on the insulation layer. Said opposite end of the first body is arranged on the second semiconductor silicon layer.

The first semiconductor silicon layer and the second semiconductor silicon layer are individually an amorphous silicone layer.

The compensation structure comprises a through hole formed in the first semiconductor silicon layer. Said one end of the first body is located above the through hole.

The efficacy of the present invention is that the present invention provides a thin film transistor with parasitic capacitance the compensation structure, which provides a compensation structure by adding a semiconductor silicon layer under the drain terminal or removing a portion of a semiconductor silicon layer in order to compensate parasitic capacitance, keeping the feed-through voltage stable and having a simple structure that is easily to realize. The present invention provides a liquid crystal display that uses a thin film transistor with parasitic capacitance compensation structure to overcome the inconsistent brightness and flicking problem caused by inconsistent central level of various areas of the liquid crystal display device.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
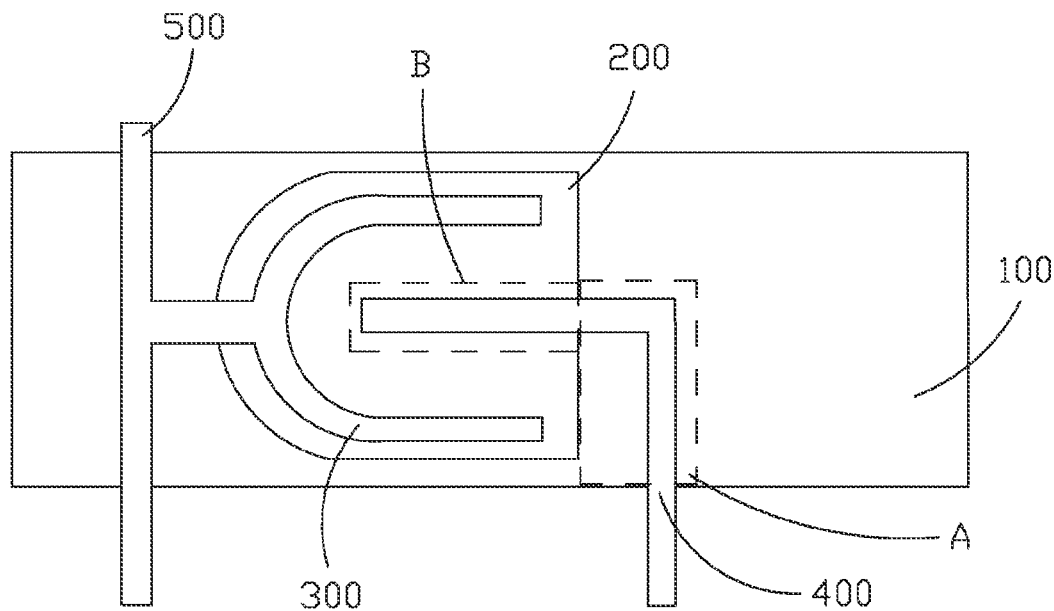
FIGS. 1 and 2 are schematic views showing conventional thin film transistors.
Figure 2:
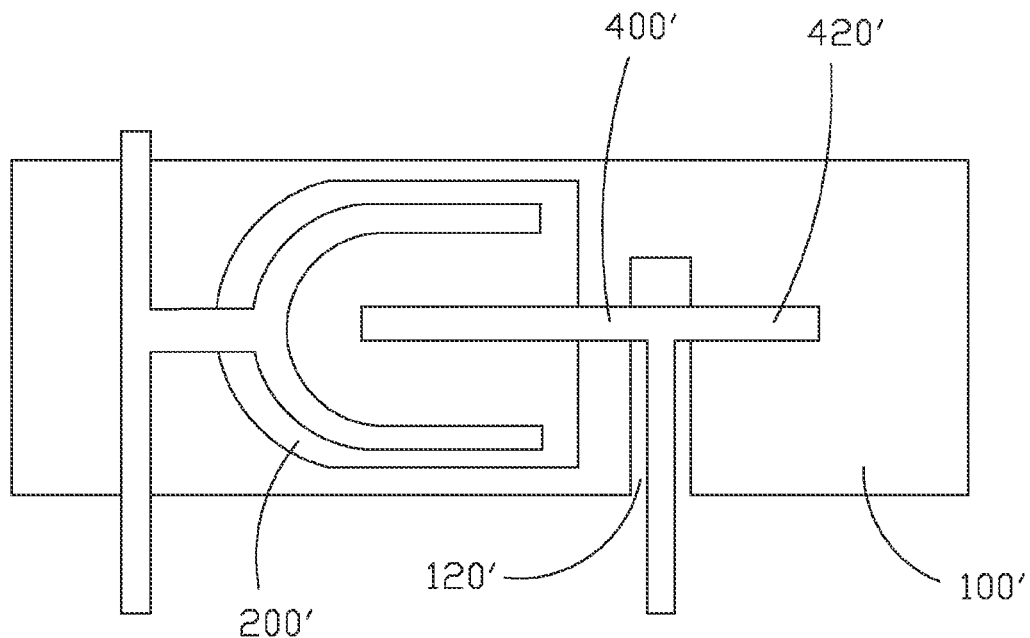
Figure 3:
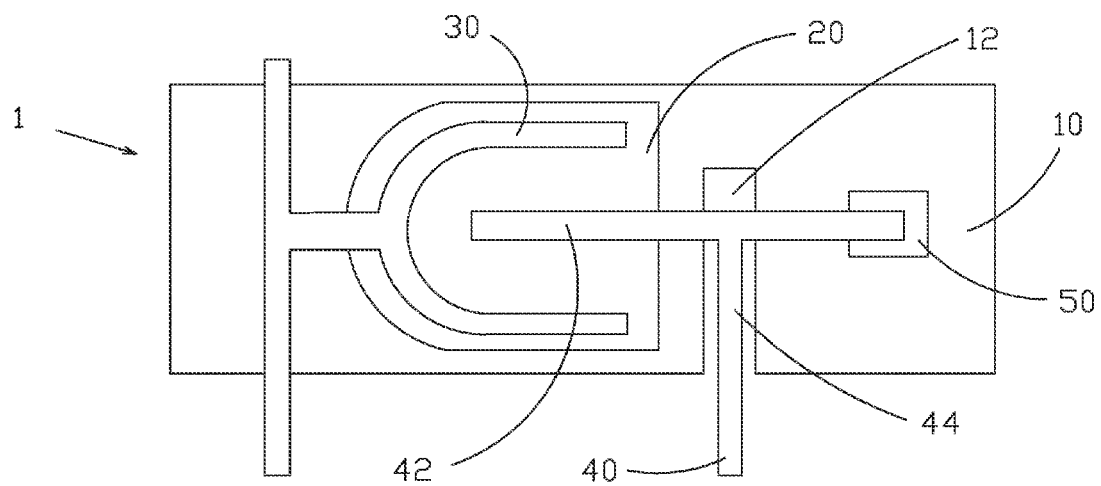
FIG. 3 is a schematic view showing a thin film transistor with parasitic capacitance compensation structure according to a first embodiment of the present invention.

Referring to FIG. 3, the present invention provides a thin film transistor with a parasitic capacitance compensation structure, generally designated at 1, comprises: a gate terminal 10, an insulation layer (not shown) formed on the gate terminal 10, a first semiconductor silicon layer 20 formed on the insulation layer, a source terminal 30 formed on the first semiconductor silicon layer 20, and a drain terminal 40. The drain terminal 40 is partially located on the insulation layer and the first semiconductor silicon layer 20.

The drain terminal 40 is of a T-shape, which comprises a first body 42 and a second body 44 perpendicular to the first body 42. The first body 42 has an end arranged on the first semiconductor silicon layer 20 and an opposite end on the insulation layer. The gate terminal 10 forms a through slot 12 in a portion corresponding to the second body 44 of the drain terminal 40. The drain terminal 40 and the gate terminal 10 overlap each other via the insulation layer to form a first overlap region and also overlap each other via the first semiconductor silicon layer 20 and the insulation layer to form a second overlap region. The first overlap region and the second overlap region respectively generate a first parasitic capacitance and a second parasitic capacitance. The first parasitic capacitance and the second parasitic capacitance together form the parasitic capacitance $C_{gd}$ between the drain terminal 40 and the gate terminal 10. The thin film transistor 1 further comprises a compensation structure, which allows the areas of the first overlap region and the second overlap region at the ends of the first body 42 to maintain unchanged when the drain terminal 40 is shifted with respect to the gate terminal 10. In the instant embodiment, the compensation structure comprises a second semiconductor silicon layer 50 formed on the insulation layer. Said opposite end of the first body 42 is located on the second semiconductor silicon layer 50. When the area of the overlap region between the drain terminal 40 and the gate terminal 10 changes due to variation occurring in the manufacture process, the second semiconductor silicon layer 50 compensates Cgd. The size of the second semiconductor silicon layer 50 is such that when the drain terminal 40 is caused to shift, said opposite end of the drain terminal 40 is not separate from the second semiconductor silicon layer 50.

The first semiconductor silicon layer 20 and the second semiconductor silicon layer 50 can individually be an amorphous silicon layer.

Figure 4:
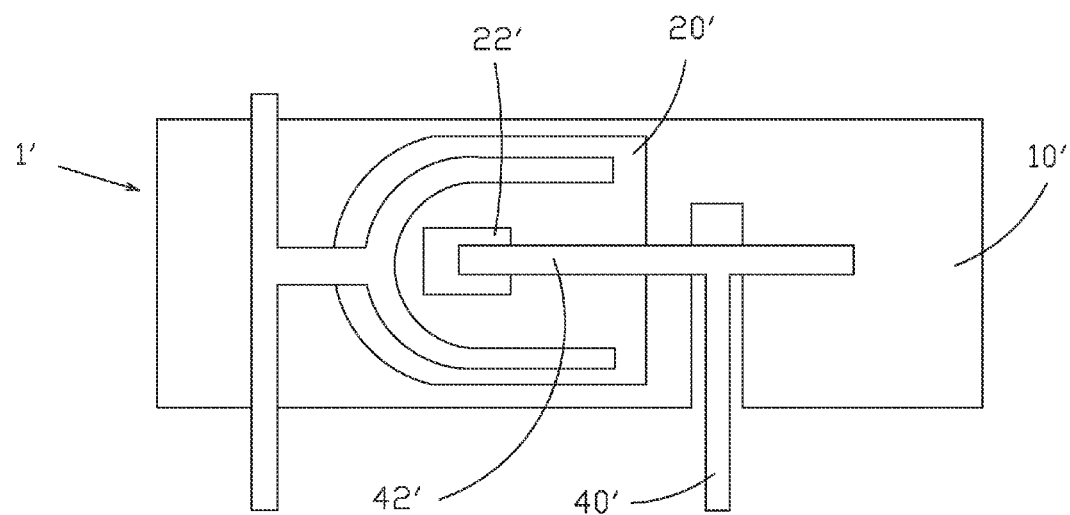
FIG. 4 is a schematic view showing a thin film transistor with parasitic capacitance compensation structure according to a second embodiment of the present invention.

Referring to FIG. 4, a second embodiment of the present invention is shown and the difference of the second embodiment from the previously discussed first embodiment is that in the instant embodiment, the thin film transistor 1' has a compensation structure, which comprises a through hole 22' formed in the first semiconductor silicon layer 20'. An end of the first body 42' is arranged above the through hole 22'. With the first semiconductor silicon layer 20' forming the through hole 22', the two ends of the first body 42' respectively overlap the gate terminal 10' via the insulation layer, whereby when the area of the overlap region between the drain terminal 40' and the gate terminal 10' changes due to variation occurring in the manufacturing process, the area of the first overlap region and the area of the second overlap region between the drain terminal 40' and the gate terminal 10' maintain unchanged. Similarly, the size of the through hole 22' is such that the end of the drain terminal does not separate from the through hole 22' when the drain terminal 40' is shifted.

The present invention provides a thin film transistor with parasitic capacitance the compensation structure, which provides a compensation structure by adding a semiconductor silicon layer under the drain terminal or removing a portion of a semiconductor silicon layer in order to compensate parasitic capacitance, keeping the feed-through voltage stable and having a simple structure that is easily to realize.

Figure 5:
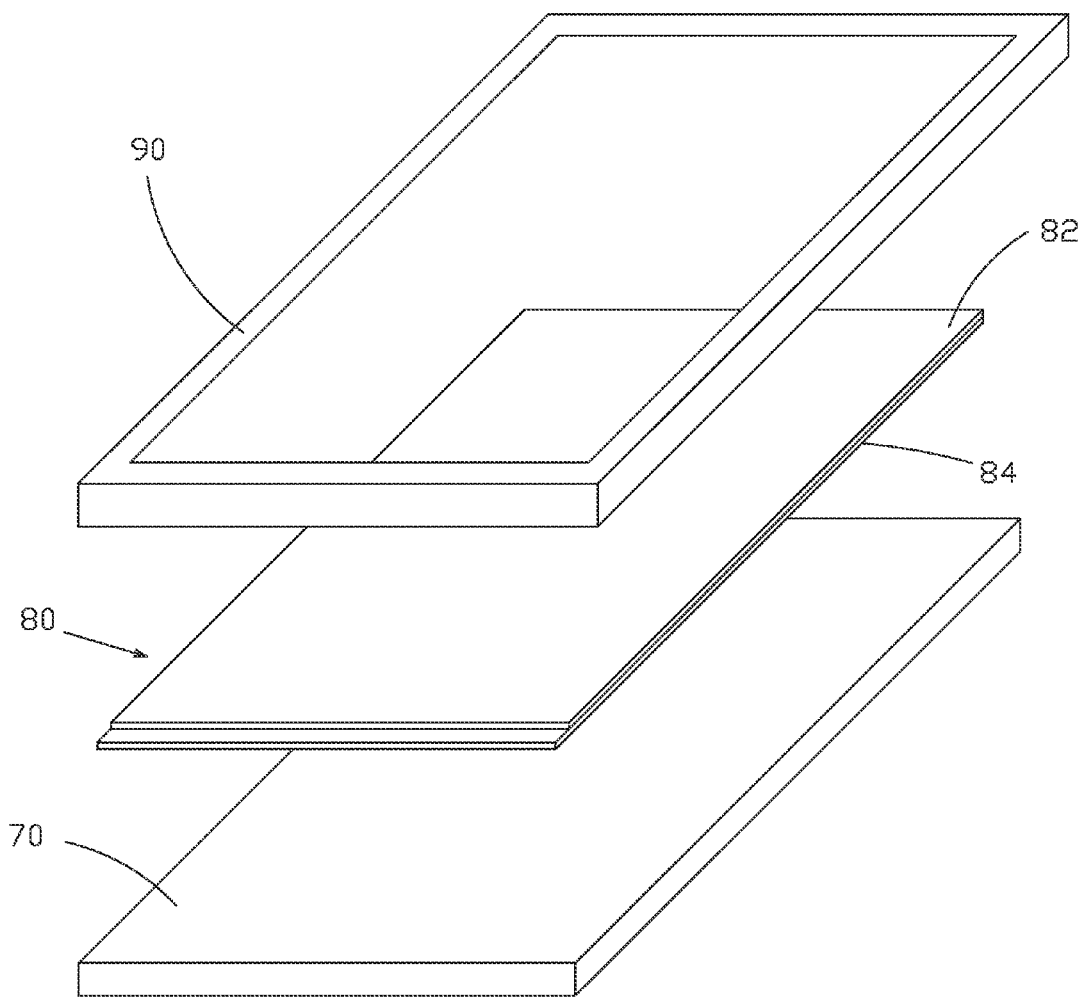
FIG. 5 is an exploded view schematically showing a liquid crystal display device according to the present invention.

Referring to FIG. 5, the present invention also provides a liquid crystal display device, which comprises a backlight module 70, a liquid crystal panel 80 arranged on the backlight module 70, and a bezel 90 arranged on the liquid crystal panel 80. The liquid crystal panel comprises a color filter substrate 82 and an array substrate 84 that are laminated on each other. The array substrate 84 comprises the thin film transistor (TFT) 1 and is electrically connected to the pixel electrode (not shown) of the thin film transistor 1. Thin film transistor 1 has the same structure as that described above and repeated description will be omitted herein.

The present invention provides a liquid crystal display device that uses a thin film transistor with parasitic capacitance compensation structure to overcome the inconsistent brightness and flicking problem caused by inconsistent central level of various areas of the liquid crystal display device.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin film transistor with a parasitic capacitance compensation structure, comprising a gate terminal, an insulation layer formed on the gate terminal, a first semiconductor silicon layer formed on the insulation layer, a source terminal formed on the first semiconductor silicon layer, and a drain terminal, the drain terminal being partially located on the insulation layer and the first semiconductor silicon layer, the drain terminal and the gate terminal overlapping each other via the insulation layer to form a first overlap region and also overlapping each other via the first semiconductor silicon layer and the insulation layer to form a second overlap region, the first overlap region and the second overlap region respectively generating a first parasitic capacitance and a second parasitic capacitance, the thin film transistor further comprising a compensation structure, whereby when the drain terminal is shifted with respect to the gate terminal, the compensation structure keeping an area of the first overlap region and an area of the second overlap region unchanged;

wherein the drain terminal is of a T-shape, which comprises a first body and a second body perpendicular to the first body, the first body having one end arranged on the first semiconductor silicon layer and an opposite end arranged on the insulation layer, the gate terminal forming a through hole in a portion corresponding to the second body of the drain terminal, the compensation structure being arranged to correspond to said one end or said opposite end of the first body.

2. The thin film transistor with a parasitic capacitance compensation structure as claimed in claim 1, wherein the compensation structure comprises a second semiconductor silicon layer formed on the insulation layer, said opposite end of the first body being arranged on the second semiconductor silicon layer.

3. The thin film transistor with a parasitic capacitance compensation structure as claimed in claim 2, wherein the first semiconductor silicon layer and the second semiconductor silicon layer are individually an amorphous silicone layer.

4. The thin film transistor with a parasitic capacitance compensation structure as claimed in claim 1, wherein the compensation structure comprises a through hole formed in the first semiconductor silicon layer, said one end of the first body being located above the through hole.

5. A liquid crystal display, comprising a backlight module, a liquid crystal panel arranged on the backlight module, and a bezel arranged on the liquid crystal panel, the liquid crystal panel comprising a color filter substrate and an array substrate that are laminated on each other, the array substrate comprising a thin film transistor and electrically connected to a pixel electrode of the thin film transistor, the thin film transistor comprising a gate terminal, an insulation layer formed on the gate terminal, a first semiconductor silicon layer formed on the insulation layer, a source terminal formed on the first semiconductor silicon layer, and a drain terminal, the drain terminal being partially located on the insulation layer and the first semiconductor silicon layer, the drain terminal and the gate terminal overlapping each other via the insulation layer to form a first overlap region and also overlapping each other via the first semiconductor silicon layer and the insulation layer to form a second overlap region, the first overlap region and the second overlap region respectively generating a first parasitic capacitance and a second parasitic capacitance, the thin film transistor further comprising a compensation structure, whereby when the drain terminal is shifted with respect to the gate terminal, the compensation structure keeping an area of the first overlap region and an area of the second overlap region unchanged.

6. The liquid crystal display as claimed in claim 5, wherein the drain terminal is of a T-shape, which comprises a first body and a second body perpendicular to the first body, the first body having one end arranged on the first semiconductor silicon layer and an opposite end arranged on the insulation layer, the gate terminal forming a through hole in a portion corresponding to the second body of the drain terminal, the compensation structure being arranged to correspond to said one end or said opposite end of the first body.

7. The liquid crystal display as claimed in claim 6, wherein the compensation structure comprises a second semiconductor silicon layer formed on the insulation layer, said opposite end of the first body being arranged on the second semiconductor silicon layer.

8. The liquid crystal display as claimed in claim 7, wherein the first semiconductor silicon layer and the second semiconductor silicon layer are individually an amorphous silicone layer.

9. The liquid crystal display as claimed in claim 6, wherein the compensation structure comprises a through hole formed in the first semiconductor silicon layer, said one end of the first body being located above the through hole.

* * * * *